(12) United States Patent
Toyama

(10) Patent No.: US 6,523,163 B1
(45) Date of Patent: Feb. 18, 2003

(54) METHOD FOR FORMING PATTERN DATA AND METHOD FOR WRITING A PHOTOMASK WITH ADDITIONAL PATTERNS

(75) Inventor: Nobuhito Toyama, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 111 days.

(21) Appl. No.: 09/714,842

(22) Filed: Nov. 16, 2000

(30) Foreign Application Priority Data

Nov. 18, 1999 (JP) ............................................. 11-327819

(51) Int. Cl.[7] ............................................. G06F 17/50
(52) U.S. Cl. ............................................. 716/21; 716/19
(58) Field of Search ...................... 716/21, 19

(56) References Cited

U.S. PATENT DOCUMENTS

| | | | |
|---|---|---|---|
| 5,366,113 A | * | 11/1994 | Kim et al. .................. 206/537 |
| 5,597,668 A | * | 1/1997 | Nowak et al. .............. 430/311 |
| 5,636,133 A | * | 6/1997 | Chesebro et al. ........... 345/441 |
| 5,671,152 A | * | 9/1997 | Lavin et al. ................ 716/19 |
| 5,763,955 A | * | 6/1998 | Findley et al. ............. 257/773 |
| 5,885,856 A | * | 3/1999 | Gilbert et al. .............. 438/129 |
| 5,923,563 A | * | 7/1999 | Lavin et al. ................ 716/19 |
| 6,327,695 B1 | * | 12/2001 | Bothra et al. ................ 716/2 |

* cited by examiner

*Primary Examiner*—Vuthe Siek
*Assistant Examiner*—Brandon Bowers
(74) *Attorney, Agent, or Firm*—Flynn, Thiel, Boutell & Tanis, P.C.

(57) ABSTRACT

A method for writing a photomask with additional patterns for making a photomask having uniform pattern density is provided, wherein the method for writing a photomask with additional patterns can be applied for a usual method of writing in which position of writing a positive resist is used and the writing is made by applying an electron beam or a laser beam to the positive resist and a method for forming pattern data used therefor is provided. This invention provides a method for writing a photomask with additional patterns which make uniform the pattern density of the photomask, wherein a positive resist is used, and an electron beam or a laser beam is applied to parts having no pattern data. A method for forming pattern data is provided wherein the method for forming pattern data is a method for processing data for forming writing data used for the method of writing, and wherein the method for processing data can be applied for not only the writing layer but also processing layers, such as a poly-silicon layer and others, wherein a great deal of time is unneeded therefor.

11 Claims, 12 Drawing Sheets

(a) np = na + xa + ya
NP = AA − FA (b) snp = np [ −sizing β ]
NB = NP − SNP (c)

(d)

(e) MAP = LP [ +sizing γ ]

(f) KP = FA ∗ MAP (g) GP = FA − DT + KP (a)

(b) LOGICAL PRODUCT
A & B (c) LOGICAL SUM
A & B (d) LOGICAL REVERSE
! (B)
(NOT B)

METHOD FOR FORMING PATTERN DATA AND METHOD FOR WRITING A PHOTOMASK WITH ADDITIONAL PATTERNS

BACKGROUND OF THE INVENTION

1. Field of the Invention

This invention relates to a method for forming pattern data and a method for writing a photomask with additional patterns and in particular to a method for processing data for forming data and writing data for a photomask with additional patterns which make pattern density of photomask uniform, and a method for writing a photomask with additional patterns which makes pattern density of photomask uniform wherein the photomask with additional patterns is used in the producing process of LSI for the main purpose of making the surface of wafer flat in the producing process of LSC.

2. Description of the Prior Art

Recently, it is being required to form a higher quality semiconductor by producing a more flat processing layer on the wafer in the production of the semiconductor, while high integration level and high function level are being required more and more for various LSIs typified by ASIC, due to the tendency toward highly efficient and lighter, thinner and smaller electronic equipment.

As an example in the art of producing a semiconductor having a flat processing layer and insulating layer on the wafer, it is disclosed in U.S. Pat. No. 5,597,668 that a photomask used for the production of the semiconductor is provided with additional patterns above and beyond a wiring pattern.

Herein, the significance of the additional patterns is described referring to FIG. 10. For example, as shown in FIG. 10(a)(i), for a processing layer (wiring layer) having patterns 511 of a high pattern density pattern portion 510 and a low pattern density pattern portion 512, the thickness of the deposited layer (insulating layer) on the processing layers changes largely according to a change in the pattern density, as shown in FIG. 10(a)(ii). As shown in FIG. 10(b)(i), for a processing layer in which pattern density is made uniform by adding additional pattern 531, the thickness of the deposited layer (insulating layer) is made uniform, as shown in FIG. 10(b)(ii), wherein 530 designates additional pattern portions. It should be appreciated that FIG. 10(a)(ii) and FIG. 10(b)(ii) are sectional views showing the concept of the process of production of a semiconductor. FIG. 10(a)(i) and FIG. 10(b)(i) are views taken from the side E1 of FIG. 10(a)(ii) and from the side E2 of FIG. 10(b)(ii), respectively.

In general, it is known that when patterning such a deposited layer or a processing layer which is layered on the deposited layer (and according to the circumstances also the deposited layer), the more flat a deposited layer of the surface of wafer on which a pattern is transferred, the higher the obtained efficiency for transferring the pattern from photomask to wafer. Therefore, forming a processing layer with uniform pattern density enables improved efficiency of transferring the pattern from photomask to wafer.

In general, production of a wafer is finished by repeatedly layering a poly-silicon layer, an insulating layer, a wiring layer and an insulating layer on a wafer in order. However, since the poly-silicon and wiring layers are deposited only on a portion in which patterns exist, which is determined on the basis of design data, the surface of the processed wafer has a varying thickness depending on whether or not patterns exist. Since the insulating layer and the wiring layer are repeatedly layered on the wafer in order, the difference in height between portions in which no pattern exists and portions in which patterns exist gradually increases. As the shapes of patterns on the wafer become minute, the permitted limit of the difference in height narrows.

Further, it is known that when patterning of a photomask is made by means of an electron lithography system, even if data dimensions for patterning of the figures are the same, dimensions of the finished patterns on the photomask differ, depending on the pattern density of the patterns to be formed.

Heretofore, data of additional patterns for producing a photomask capable of generating additional patterns on the processing layer was generated by a method for generating additional patterns as shown in FIG. 11, wherein steps S710 to S740 designate processing steps. Referring to FIG. 12, the state of a wafer at each processing step of FIG. 11 is illustrated.

In step S710 of FIG. 11, areas in which additional patterns are arranged are first determined. In FIG. 12(a), "dp" designates wiring patterns included in design data DP. Further, as shown in FIG. 12(b), the minimum interval between wiring patterns and additional patterns is designated as "dist". Figure NA which is over-sized with respect to wiring patterns dp is formed through the sizing figure processing. Area data AD having an area ad in which additional pattern areas are arranged is formed by subtracting the area of figure NA from the area da of the whole of design data DP through the Boolean NOT (FIG. 12(b)).

In step S720 additional patterns are generated in the whole area of FIG. 11. Original arrangement of the additional patterns dt is formed in such a manner that the additional patterns are formed over the entire area ad (FIG. 12(c)), wherein rectangular additional patterns are arranged in the second dimension.

The logical product of area ad in which additional patterns are arranged and arrangement of additional patterns dt is taken, by which arrangement of additional patterns are obtained from the arrangement of additional patterns included in the area ad in which additional patterns are to be arranged (FIG. 12(d), S730)). The arrangement of additional patterns obtained through Boolean AND processing has broken additional patterns and fine additional patterns dd.

In step S740 broken additional patterns dd are eliminated. Since fine figures in the production of a wafer are problematic, the final patterns have an arrangement of additional patterns which does not include broken additional patterns dd, by under-sizing and over-sizing through the sizing figure processing (FIG. 12 (e)). Then, through the Boolean OR, the final pattern data FPO with additional patterns can be obtained from additional pattern data shown in FIG. 12(d) or additional pattern data shown in FIG. 12(e) and original design pattern data DP (FIG. 12(f), S750). Namely, design pattern data dp and additional patterns dt are combined. The pattern data FPO with additional patterns is the data used to produce the photomask.

However, in the production of the photomask, a writing system is generally used in which a positive resist is applied and patterns are written on the positive resist by applying an electron beam or a laser beam to areas in which no pattern data exist.

In the conventional method for generating additional pattern data shown in FIG. 11, design data and additional patterns are formed independently. However, in the above-mentioned writing method using a positive resist, exposure of the design pattern results in writing of the whole additional patterns area so that additional patterns cannot be formed unless the additional patterns are written first. Therefore, in the conventional system for generating additional pattern data mentioned in the description of prior art, additional pattern data are formed independently. Therefore, it is needed to prepare one synthetic pattern data. However, as the design pattern is made more minute, data size of both design pattern data and additional pattern data becomes enormous. It is also necessary to form data having design pattern data and additional data together. Further, time is required for synthesizing of design data and additional data.

In order to simplify the system for generating additional pattern data shown in FIG. 11, an object is restricted only to the wiring layer, wherein the poly-silicon layer, also a deposited layer, is not taken into consideration. In conventional art, additional patterns cannot be generated to the poly-silicon layer. Further, in this system, an area designated for no additional patterns cannot be applied in the wiring layer, even where such is the intention of the designer or where no additional patterns should be present based on the relation of the wiring layer to another design layer.

After generation of additional pattern data, it is necessary to eliminate broken additional patterns or fine additional patterns which are problematic in the production of the wafer. In conventional art, such broken additional patterns or fine patterns are eliminated by under-sizing and over-sizing through the sizing figure processing. However, such additional patterns cannot have hierarchy. Therefore, since the number of figures amounts to anywhere from thousands to hundred millions, the sizing processing takes a great deal of time. Such additional pattern data are processed with a data format called GDSII. As mentioned above, since additional patterns cannot have hierarchy and the number of figures of additional patterns amounts to thousands to hundred millions, the additional patterns alone require some gigabytes of file capacity. Therefore, it takes a great deal of time and labor to handle additional patterns.

As above-mentioned, additional pattern data obtained by the conventional system for generating additional patterns shown in FIG. 11 cannot be applied as a usual writing system for writing patterns by applying an electron beam or a laser beam to parts with no pattern data. Therefore, a solution to this problem is desired. Further, in the system for generating additional pattern data shown in FIG. 11, additional patterns cannot be generated on a poly-silicon layer. Therefore, a solution to this problem is also desired. Further, in the system for generating additional patterns shown in FIG. 11, broken additional patterns or fine additional patterns are eliminated through under-sizing and over-sizing of the sizing figure processing. However, since additional patterns cannot have hierarchy and the number of figures is in the thousands to hundreds of thousands, the sizing processing takes a great deal of hours. Therefore, handling of additional patterns takes much effort.

SUMMARY OF THE INVENTION

Accordingly, it is a first object of the present invention to provide a method for forming writing pattern data with additional pattern data for making a photomask having uniform pattern density, wherein this method for forming writing pattern data can be applied not only for wiring layers but also for processing layers, such as a poly-silicon layer, and further wherein it does not take a great deal of time to process data. Further, it is a second object of the present invention to provide a method for writing a photomask with additional patterns having uniform pattern density, wherein this method for writing a photomask with additional patterns can be applied for a writing system in which a positive resist is used and wherein additional patterns can be written by applying an electron beam or a laser beam to parts having no pattern data.

The first object of the present invention is attained by that in designing layout of the electronic circuit or in forming the production data of the photomask, when a minimum interval MI between each figure dp of design pattern data DP which has been designed without consideration to additional patterns and each figure dt of data DT for additional patterns to be formed in a data area is set so as to avoid the interference of each figure dp of the design pattern data DP with each figure dt of data DT for additional patterns to be formed, the following steps are performed. First, the sizing figure processing is taken to the design pattern data DP so that pattern data DP1 having an area NA with no additional pattern is formed by over-sizing each figure dp of pattern data DP by the minimum interval MI, and the Boolean NOT is taken to the design pattern data DP and the pattern data DP1 so as to remove each pattern data DP of the design pattern data DP from the area NA with no additional pattern so that reverse main pattern data MP having reverse patterns mp is formed. The Boolean NOT is then taken to the whole area AA showing the whole area aa of design pattern data area and the pattern data DP1 so as to subtract the area NA of no additional pattern from the whole area aa so that a basic additional pattern area data DA forming a basic additional pattern area da is generated. Next, an area of forbidden additional pattern is determined and the area of the forbidden additional pattern is subtracted from the basic additional pattern area DA so that additional pattern area data FA with additional pattern area fa is formed. Data DT for additional patterns is then generated in which figure dt is placed regularly in the whole area corresponding to the design pattern data area. The Boolean NOT is then taken to the additional pattern area data FA and the data DT for additional patterns so as to remove each figure of data DT for additional patterns from the additional pattern area fa so that reverse additional pattern data FP is formed.

Further, the first object of the present invention is attained for the designing layout of electronic circuit or in forming the production data of the photomask, when a minimum interval MI between each figure dp of design pattern data DP which has been designed without consideration to additional patterns and each figure dt of data DT for additional patterns to be formed in a data area is set so as to avoid the interference of each pattern data DP of the design data pattern data DP with each pattern dt of data DT for additional patterns to be formed, the following is done. The sizing figure processing is first taken to the design pattern data DP so that pattern data DP1 having an area NA with no additional pattern is formed by over-sizing pattern data DP by the minimum MI, and the Boolean NOT is taken to the design pattern data DP and the pattern data DP1 so as to subtract each pattern data DP of the design pattern data DP from the area NA with no additional pattern so that reverse main pattern data MP having reverse patterns mp is formed. The Boolean NOT is then taken to the whole area AA showing the whole area aa of design pattern data area and the pattern data DP1 so as to subtract the area NA of no additional pattern from the whole area aa so that a basic additional pattern area data DA forming a basic additional pattern area da is formed. Next, data DT for additional patterns is generated in which patterns dt forming the basis of the additional patterns area is regularly arranged for the whole area corresponding to the design pattern data area. The Boolean NOT is then taken to the basic additional pattern data DA and the data DT for additional patterns so as to subtract the data DT for additional patterns from the basic additional pattern area da so that reverse additional pattern data FP2 is formed. An area of forbidden additional pattern is then determined and reverse additional pattern data FP is formed by adding the area of forbidden additional pattern to the reverse additional data pattern FP2 through the Boolean OR.

The second object of the present invention is attained by development of a method for writing a uniform pattern density photomask with additional patterns used in the production of LSI in order to make the surface of the process layer(s) of the wafer flat in the production of LSI, the reverse main pattern data MP, reverse additional pattern data FP, the second reverse additional main data GP or the reverse additional pattern data GPi ($1 \leq i \leq n$) are used directly for photomask writing data or fractured to photomask writing data, respectively, and writings by the respective writing data are made separately so that writing is made on the positive resist applied on a substrate for the photomask for superimposing the writing data.

Herein, the logical operation processing shown in figure data is briefly explained referring to FIG. 9. As shown in FIG. 9($a$), a rectangular figure (pattern) A and a rectangular figure (pattern) B are represented in a data area Da. The logical product of the figure A and the figure B, the logical sum of the figure A and the figure B, the reverse of the figure B (also called Inverse or NOT (B) are shown as the shadowed portions in FIG. 9($b$), FIG. 9($c$), and FIG. 9($d$), respectively. As the content of real processing is well-known, this content is omitted herein.

The present invention is a method for processing data for forming writing data for a photomask with additional patterns which photomask is provided with additional patterns so as to make the pattern density of the photomask uniform. The method can be applied for processing layers, such as poly-silicon layers, and others. This method makes it possible to provide a method for forming pattern data without the necessity of expending a great deal of time and the method makes it possible to provide a method for writing a photomask with additional patterns which is applicable for a writing system in which writing of additional patterns is made by applying an electron beam or a laser beam to parts with no pattern data by using a positive resist.

In particular, additional pattern data having an additional pattern generating area with higher freedom and areas of no additional pattern in which any arrangement of additional pattern is prohibited can be formed, wherein in the production of the photomask, it is not needed to combine additional patterns of generated additional pattern data and a pattern of design data so that additional pattern data can be generated with high speed and lower capacity of output.

By such a construction, a method of writing according to the present invention is a method for writing a photomask with additional patterns which photomask is provided with additional patterns so as to make pattern density of the photomask uniform, wherein a positive resist is used, and it makes possible to provide a method of writing wherein the method can be applied for a system in which a positive resist is used and an electron beam or a laser beam is applied to parts having no pattern data, and forming of pattern data for writing is easy.

PREFERRED EMBODIMENTS OF THE INVENTION

Figure 1:
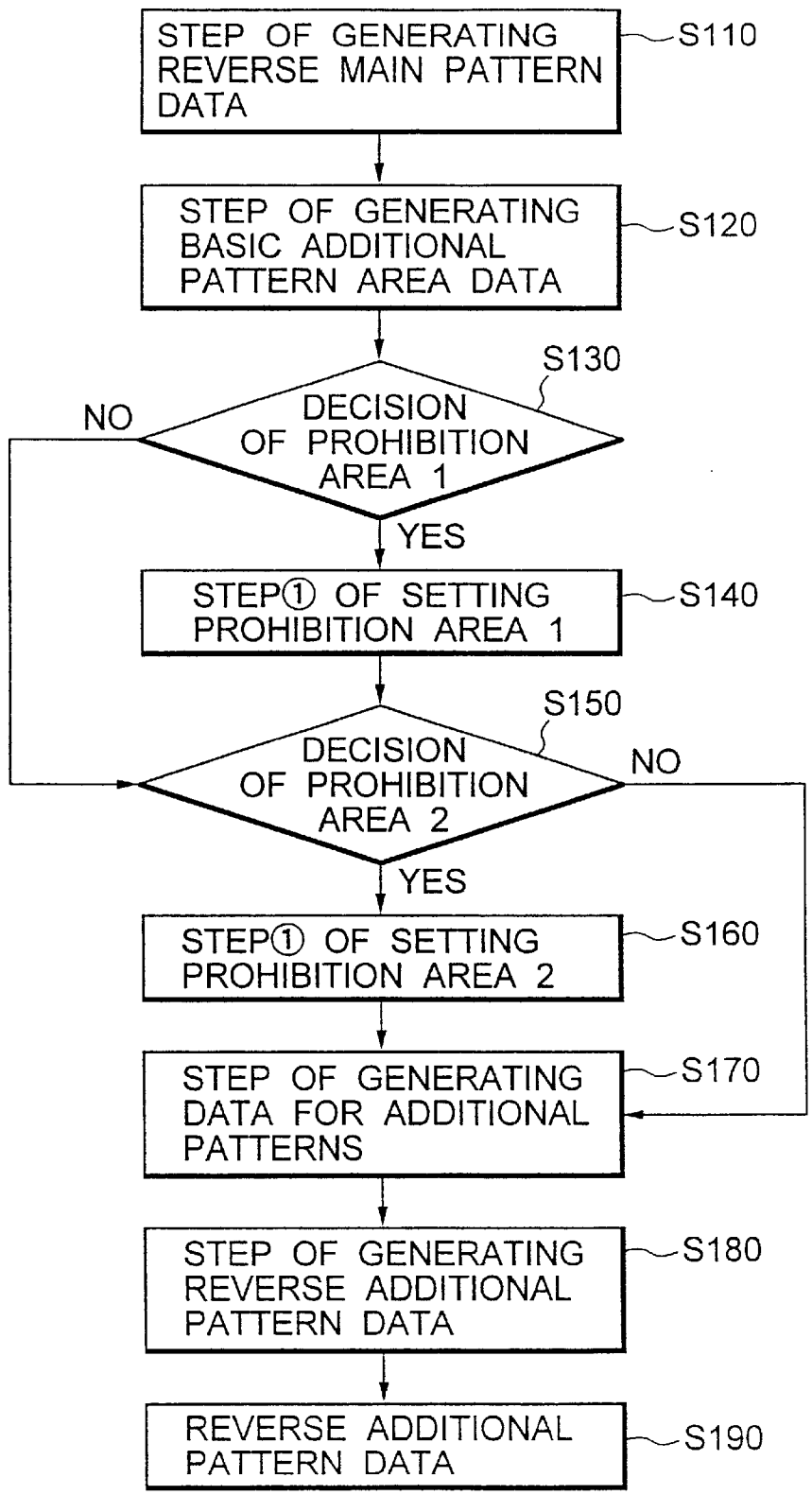
FIG. 1 is a flowchart showing processing made according to a first embodiment of a method for forming pattern data of the present invention.
Figure 2:
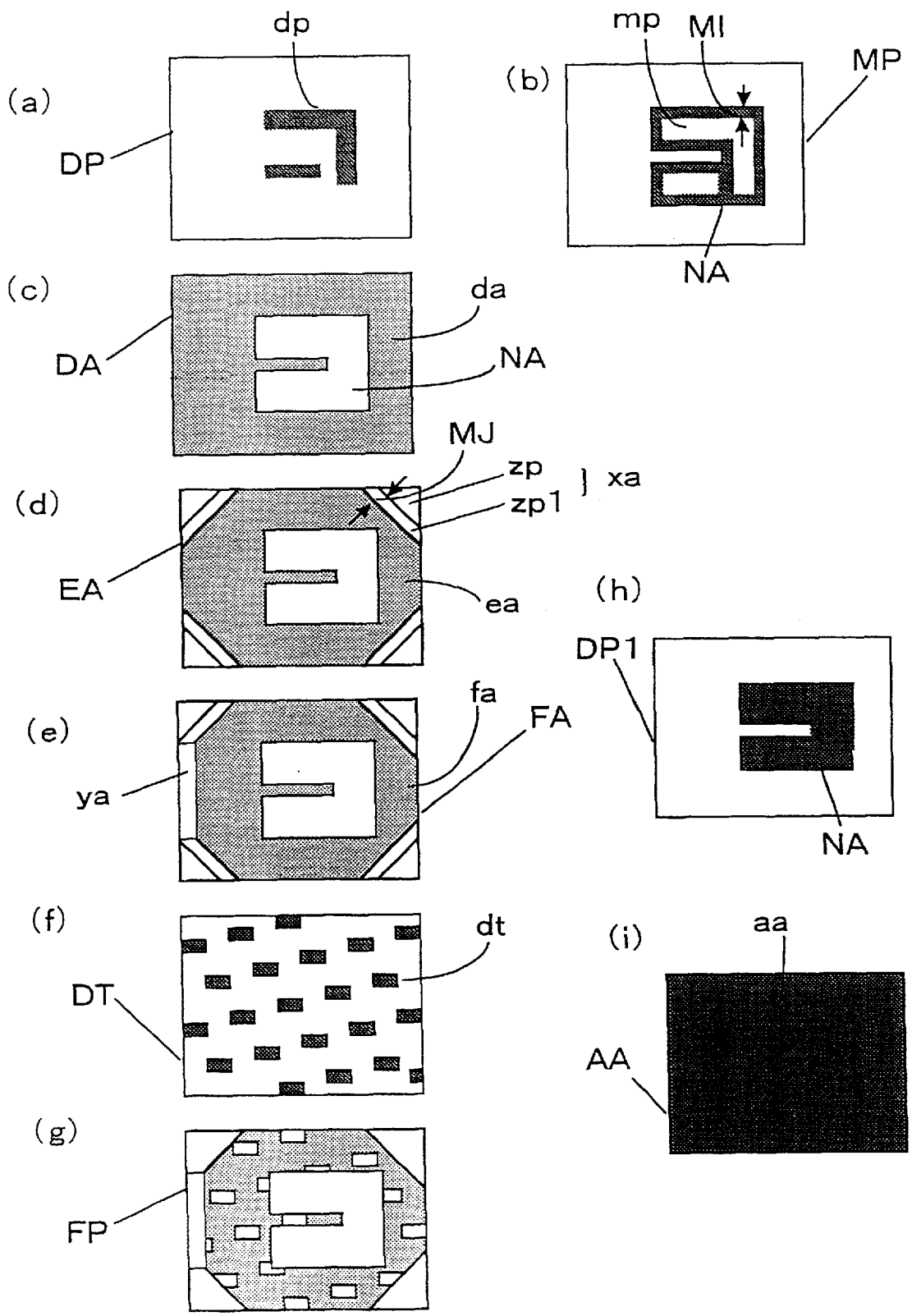
FIGS. 2($a$)–($i$) are views showing a state of data in each processing made according to the first embodiment of a method for forming pattern data of the present invention.
Figure 3:
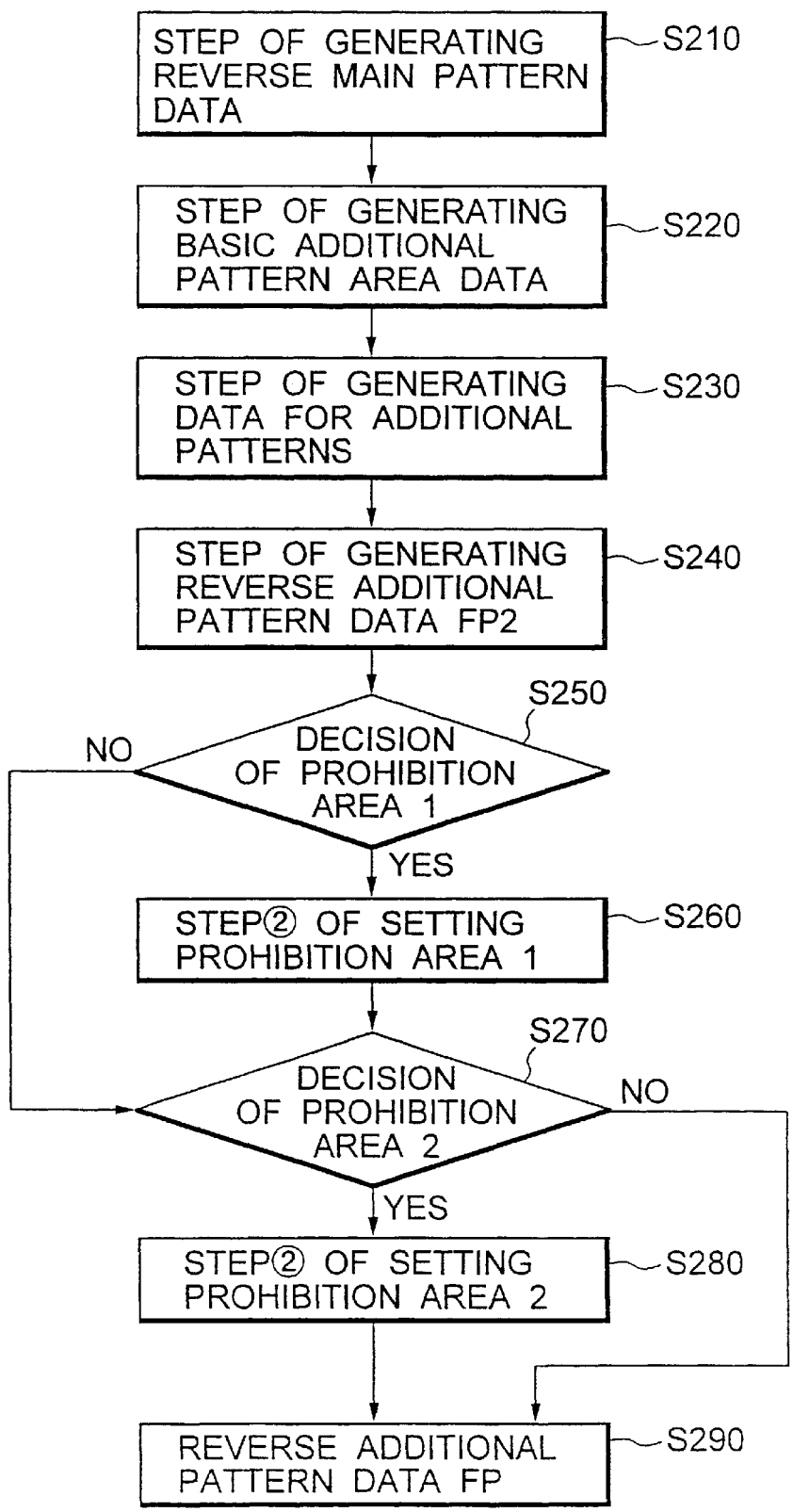
FIG. 3 is a flowchart showing processing made according to a second embodiment of a method for forming pattern data of the present invention.
Figure 4:
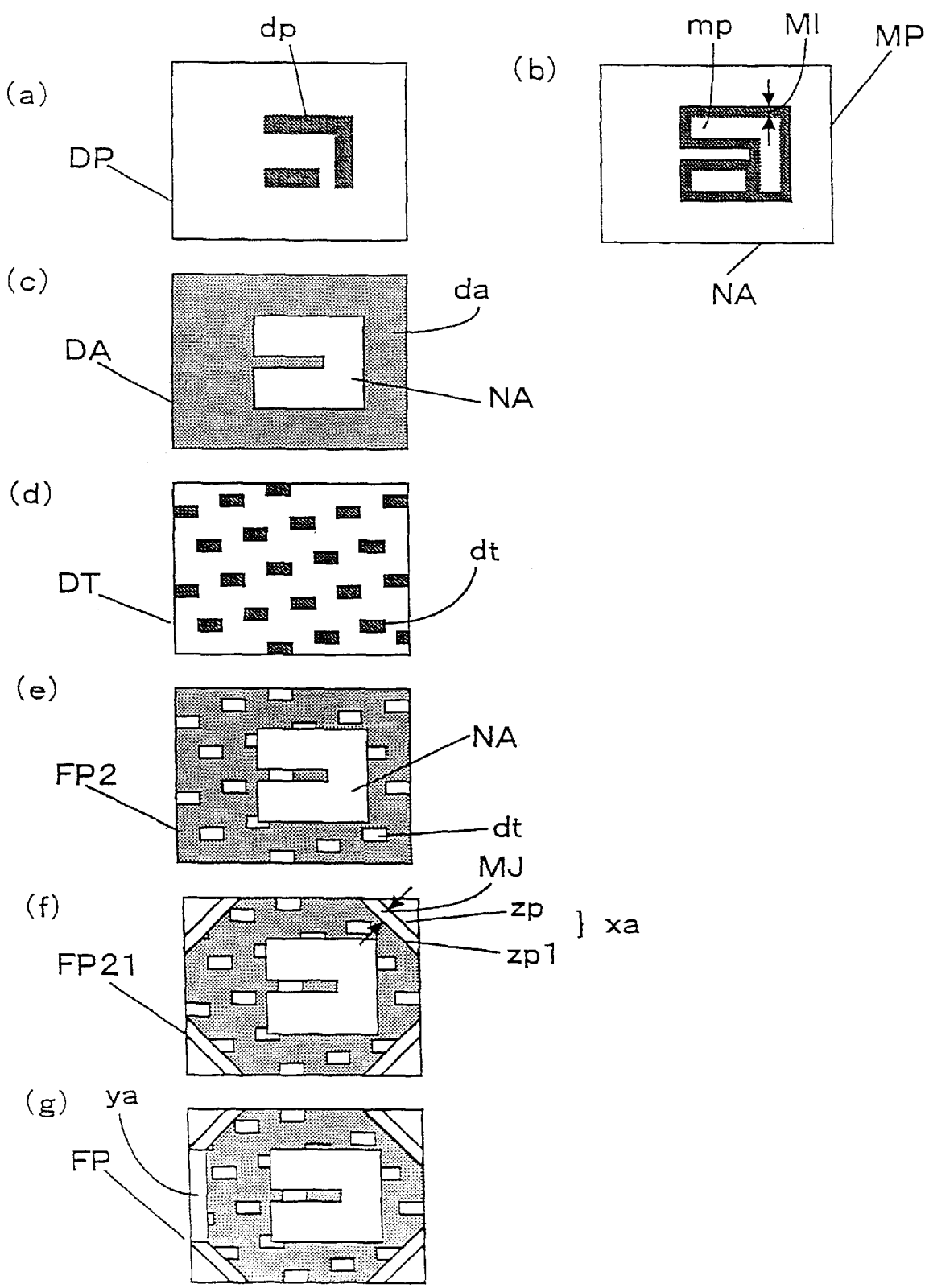
FIGS. 4($a$)–($g$) are views showing a state of data in each processing made according to the second embodiment of a method for forming additional pattern data of the present invention.
Figure 5:
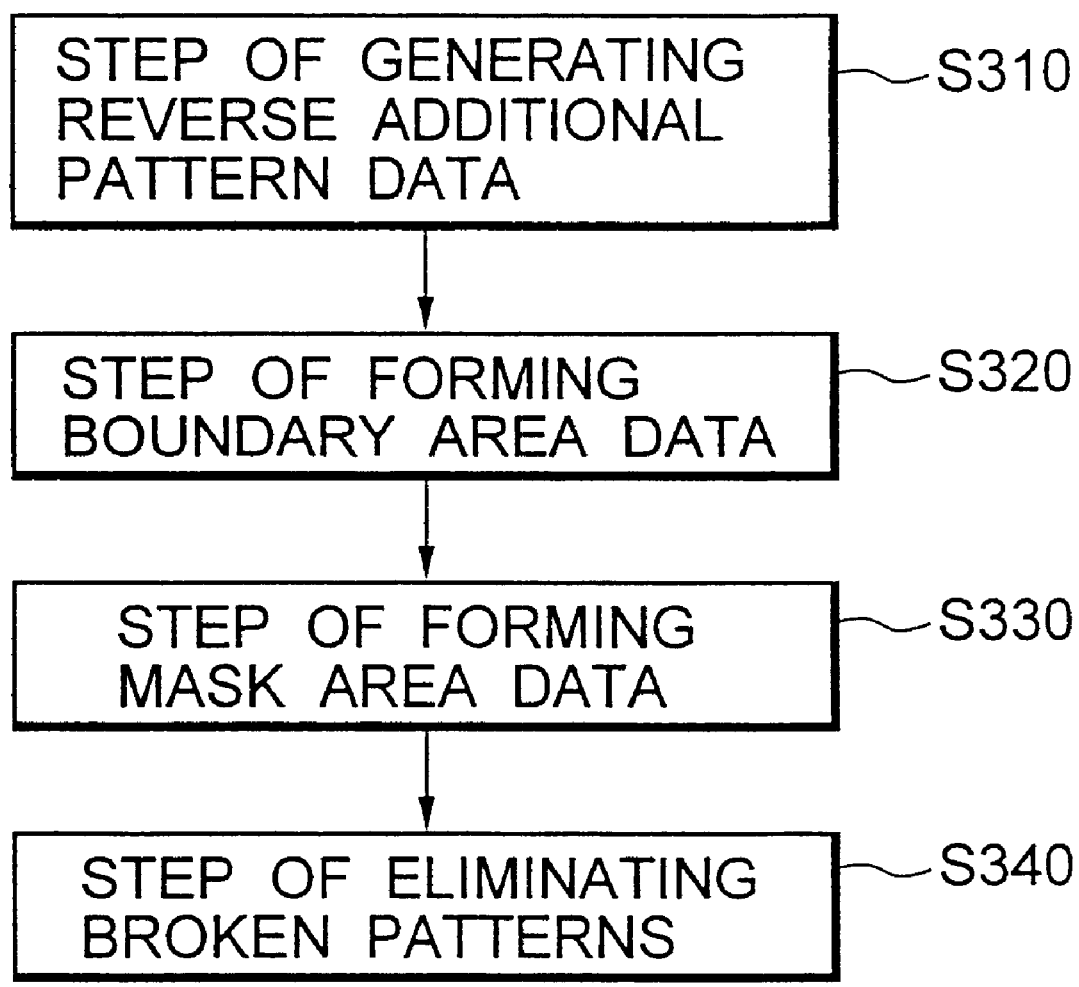
FIG. 5 is a flowchart showing processing of eliminating broken additional patterns made according to a third embodiment of a method for forming pattern data of the present invention.
Figure 6:
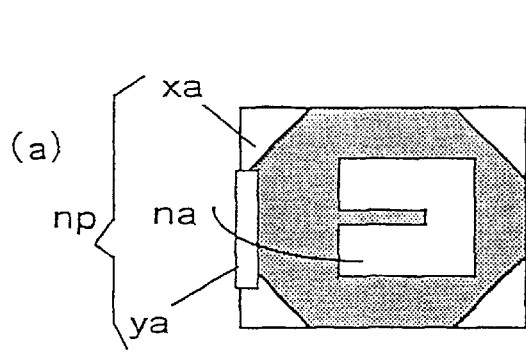
FIGS. 6($a$)–($g$) are views showing a state of data in processing of broken additional patterns made according to the third embodiment of a method for forming pattern data of the present invention.
Figure 6:
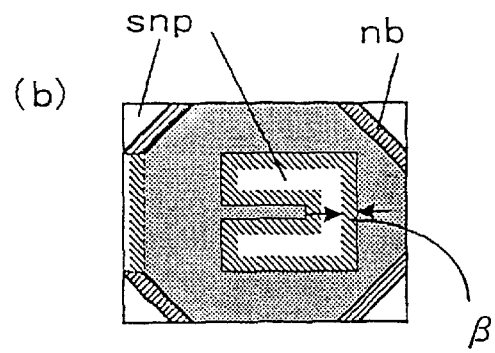
Figure 6:
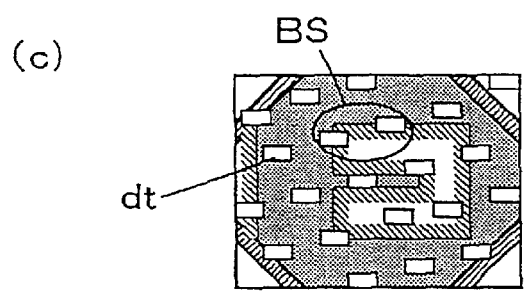
Figure 6:
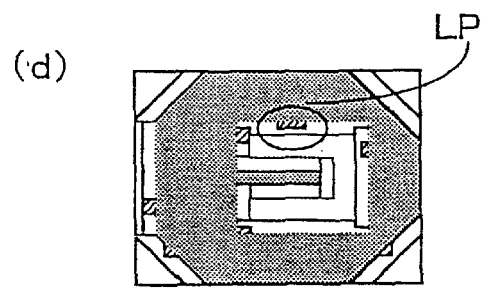
Figure 6:
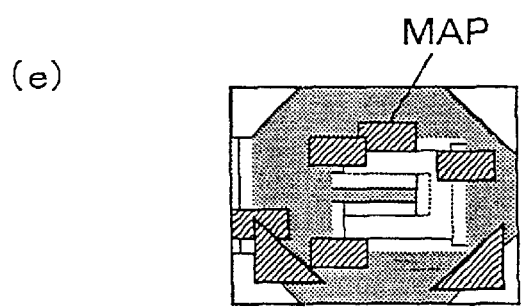
Figure 6:
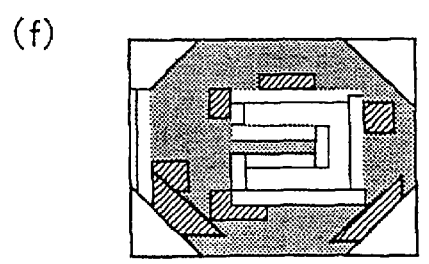
Figure 6:
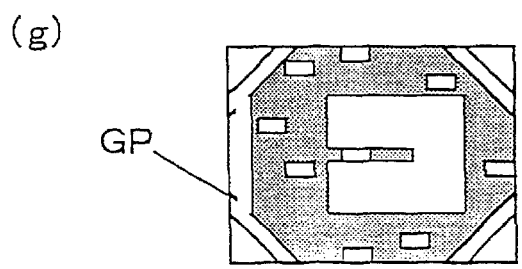
Figure 7:
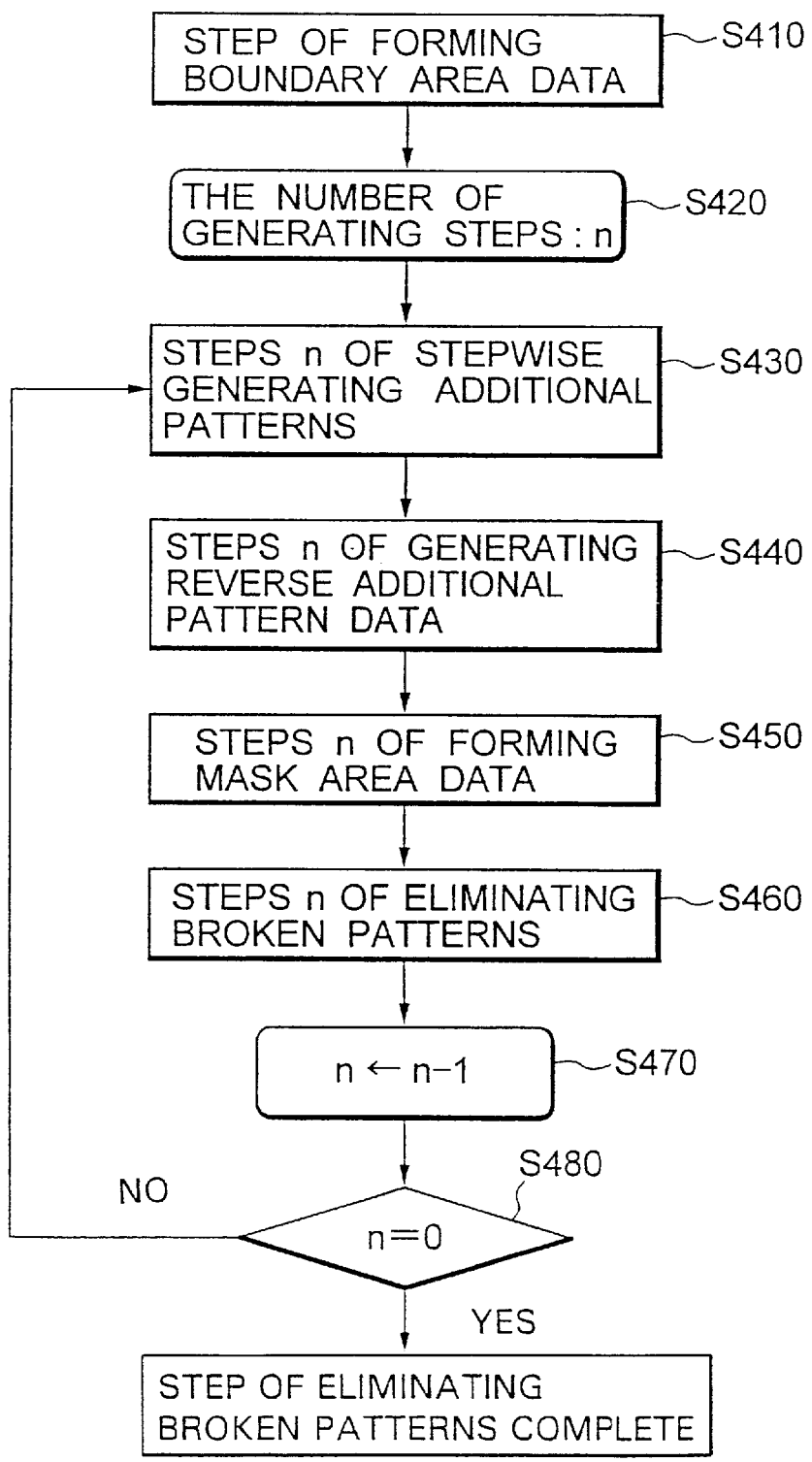
FIG. 7 is a flowchart showing processing of eliminating broken additional patterns made according to a fourth embodiment of a method for forming pattern data of the present invention.
Figure 8:
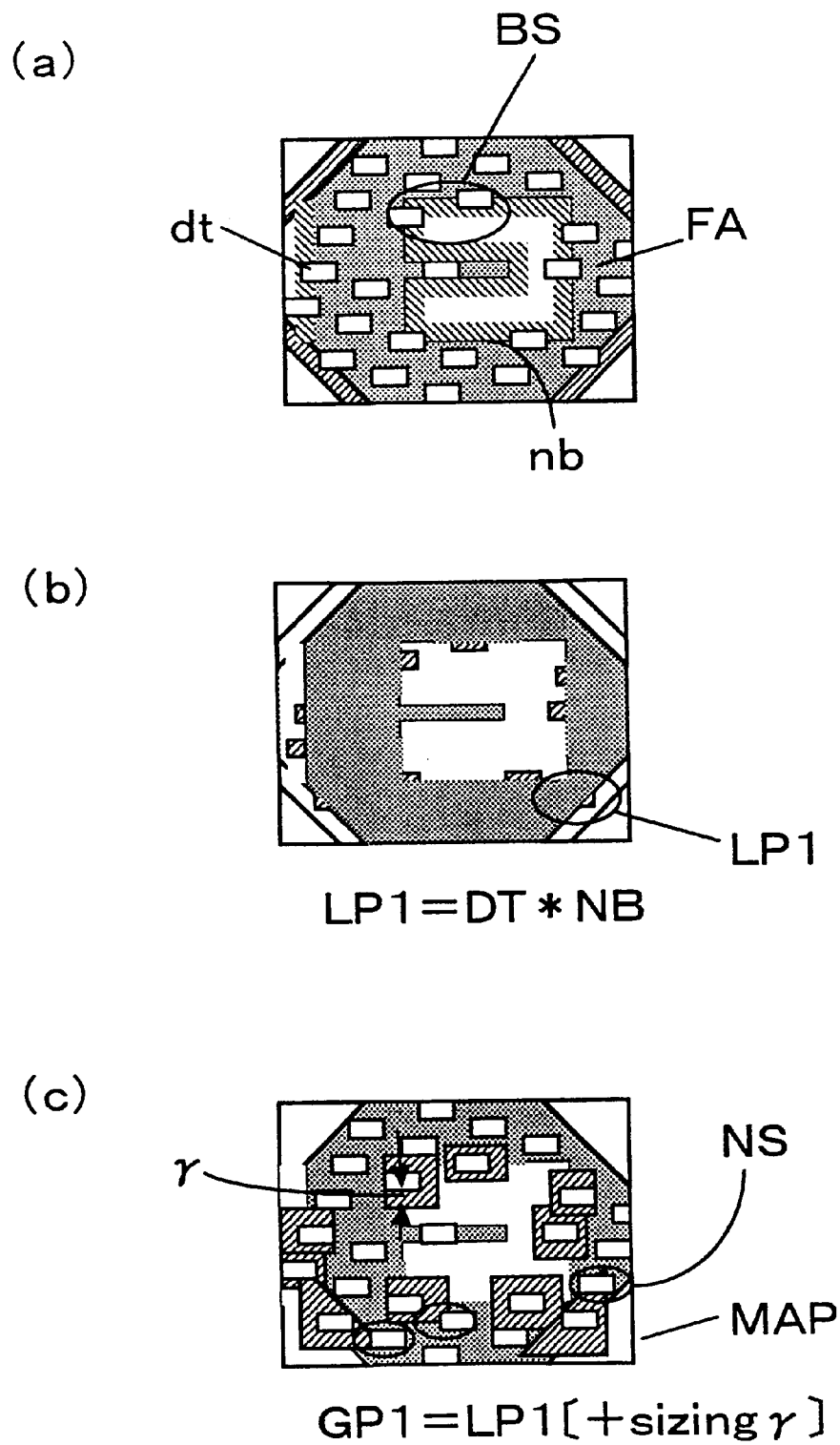
FIGS. 8($a$)–($c$) are views showing a state of data in processing of eliminating broken additional patterns made according to the fourth embodiment of a method for forming pattern data of the present invention.
Figure 9:
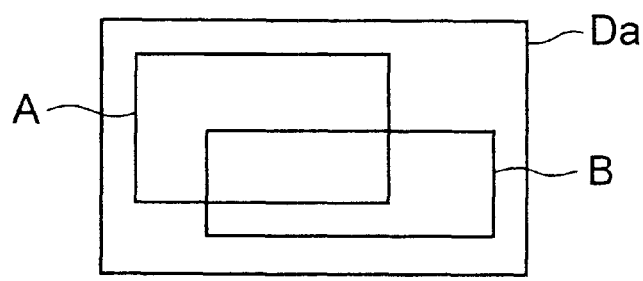
FIGS. 9($a$)–($d$) are views for explaining the figure operation processing of pattern data.
Figure 9:
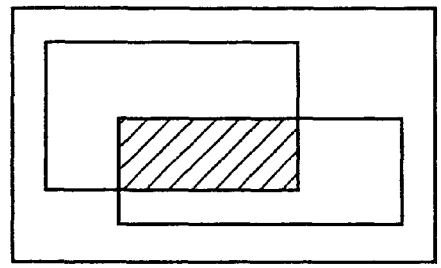
Figure 9:
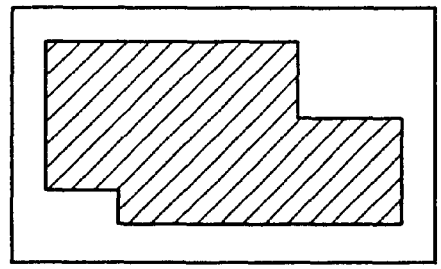
Figure 9:
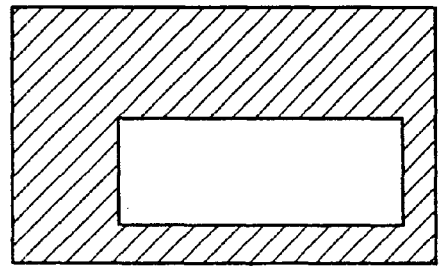
Figure 10:
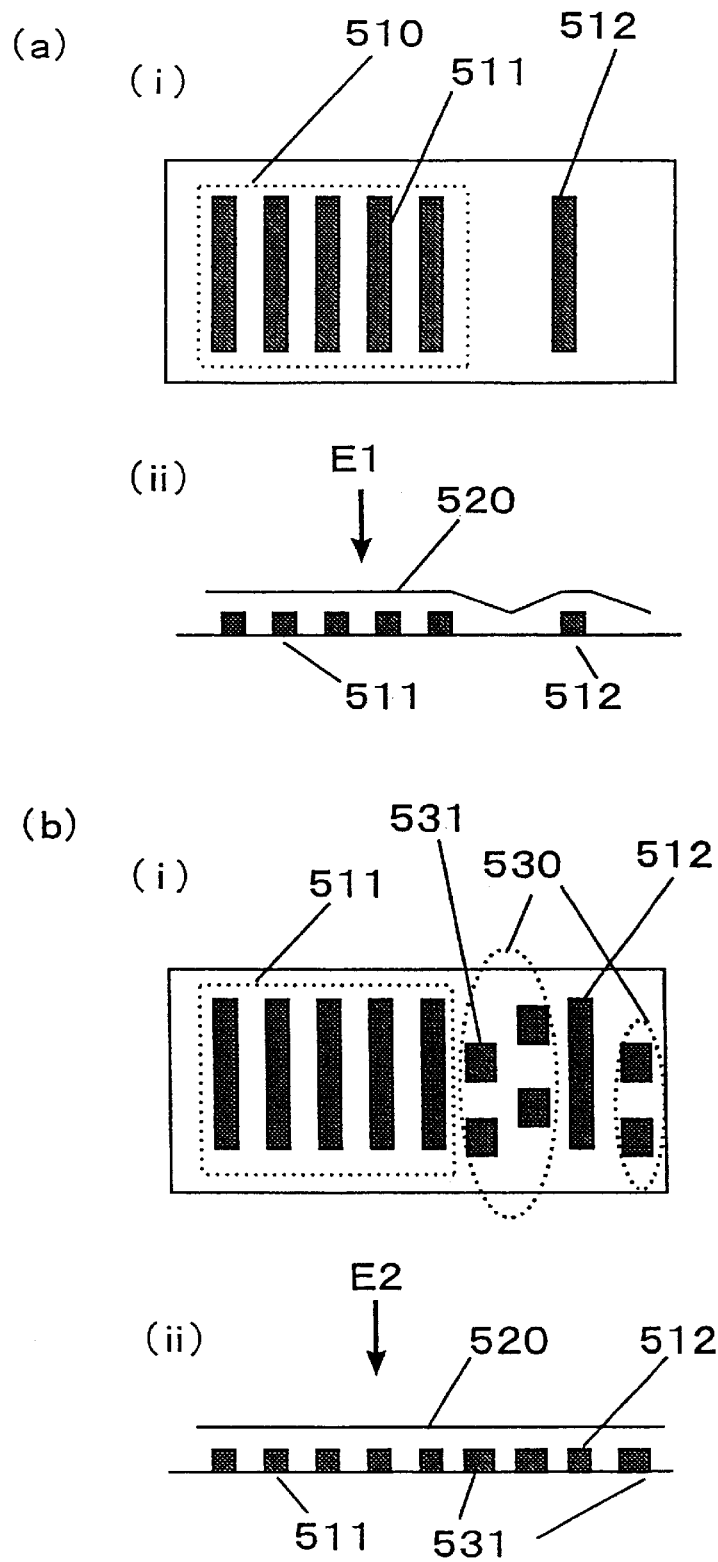
FIGS. 10($a$)(i)–($b$)(ii) are views showing a state of processing the surface of a wafer of the conventional art.
Figure 11:
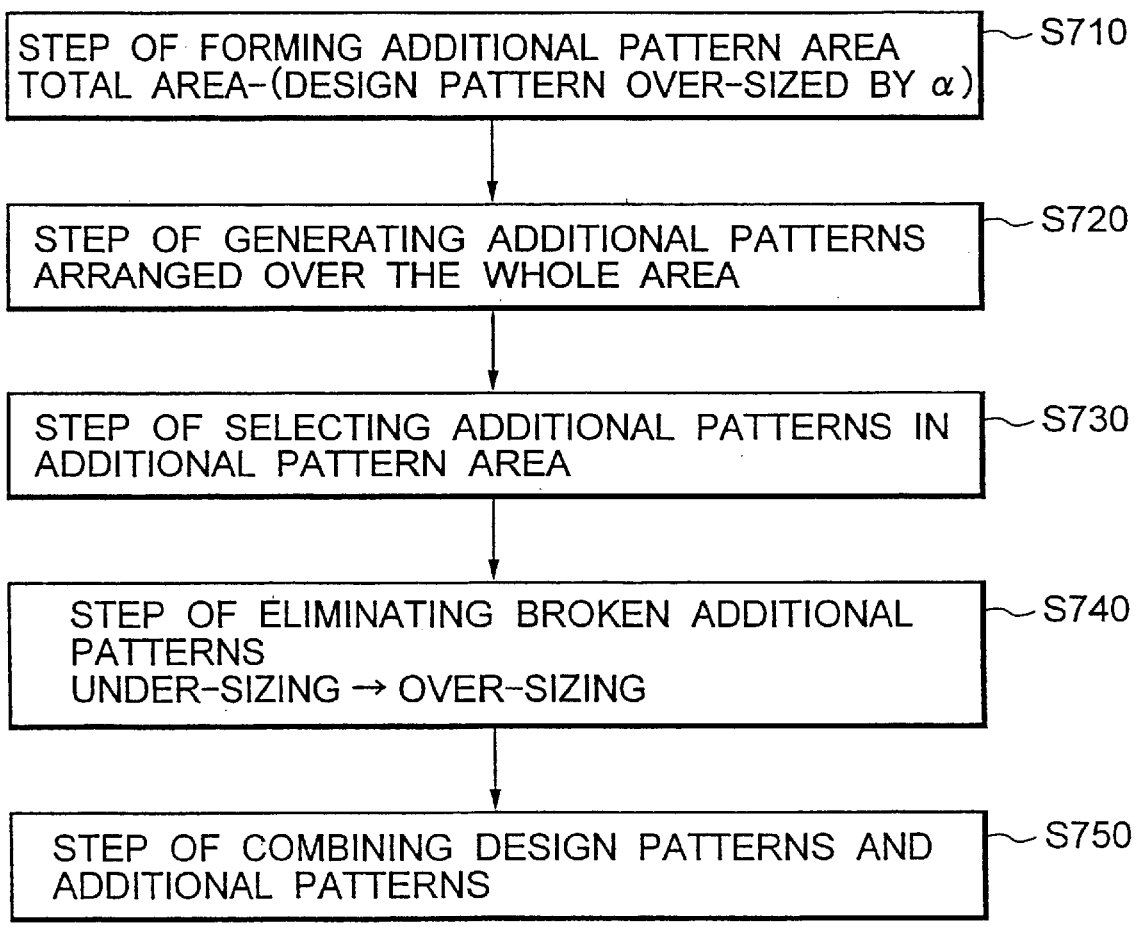
FIG. 11 is a flowchart of a method for forming pattern data of the conventional art.
Figure 12:
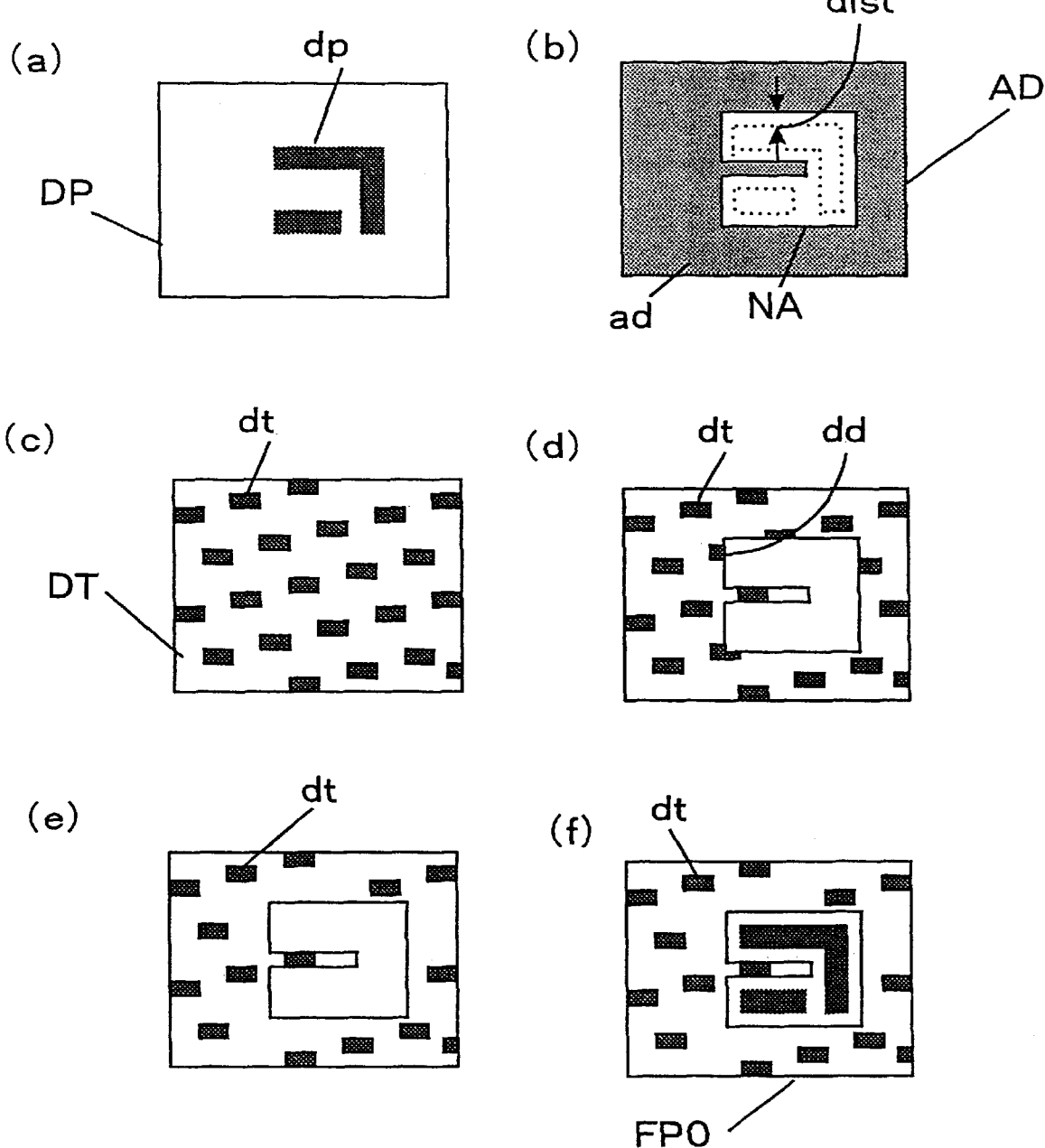
FIGS. 12($a$)–($f$) are views showing a state in each processing made according to a method for forming pattern data of the conventional art.

FIG. 1 is a flowchart showing a first example of processing made according to a first embodiment of a method for forming additional pattern data of the present invention. FIG. 2 is a view showing a state of data in each processing made according to the first embodiment of a method for forming additional pattern data of the present invention. FIG. 3 is a flowchart of the second example of processing made according to a second embodiment of a method for forming additional pattern data of the present invention. FIG. 4 is a view showing a state of data in each processing made according to the second embodiment of a method for forming additional pattern data of the present invention. FIG. 5 is a flowchart showing processing of eliminating broken additional patterns made according to the third embodiment of a method for forming pattern data of the present invention. FIG. 6 is a view showing a state of data in processing of broken additional patterns made according to the third embodiment of a method for forming pattern data of the present invention. FIG. 7 is a flowchart showing processing of eliminating broken additional patterns made according to the fourth embodiment of a method for forming pattern data of the present invention. FIG. 8 is a view showing a state of processing of eliminating broken additional patterns made according to the fourth embodiment of a method for forming pattern data of the present invention.

In FIGS. 2, 4, 6, and 8, DP, DP1, MP, EA, FA, DT, FP, FP2, FP21, NP, SNP, NB, LP, MAP, KP, GP, LP1, MAP1, GP1 and GPi designate pattern data, respectively, dp and dt designate pattern (called figure), respectively, NA, mp, da, zp, zp1, ea, xa, ya, np, snp and nb designate area, respectively, MI, MJ, γ, β, designate amount of change in size, respectively, and BS and NS designate set, respectively. Further, S110 to S480 designate steps of processing.

The first embodiment of a method for forming pattern data of the present invention is explained referring to FIGS. 1 and 2. Pattern data of the present example are data applicable for a writing system wherein a positive resist is used and writing is made by applying an electron beam or a laser beam to parts having no pattern data. In this embodiment, in order to explain it simply, a case is illustrated wherein design data is set to be pattern data DP having only patterns dp (FIG. 2(a)), and reverse main pattern data FP for generating additional patterns corresponding to the pattern data DP and main pattern data for forming patterns corresponding to patterns dp of the design pattern data DP are generated. First, in reverse main pattern generating step S110, reverse main pattern data for forming patterns corresponding to design patterns dp with no additional pattern is formed.

Minimum interval MI between patterns dp and each additional pattern of additional pattern data is set to a given amount (for example $2\mu$), patterns dp of the design pattern data DP are over-sized by distance MI through the sizing figure processing so that area data DP1 having area NA is formed (FIG. 2(h)). Then, through the Boolean NOT, patterns dp of the design pattern data DP are subtracted from area NA of area data DP1 so that reverse main pattern data MP is obtained (FIG. 2(b)). This reverse main pattern data MP corresponds to data for writing patterns dp of pattern data DP which is the design data. Namely, the reverse main pattern data MP is treated separately from additional pattern data in case of writing in the production of the photomask.

Then, in basic additional pattern area generating step S120 of FIG. 2, an area which becomes the base of generating additional patterns is formed. Through the Boolean NOT, area NA of the above-mentioned area data DP1 is subtracted from area aa of the whole area data AA (FIG. 2(i)) so that basic additional area data DA, having basic additional pattern area da, is formed (FIG. 2(c)).

In the case where a prohibition area 1 is to be set up in which a distance should be kept from additional patterns to be formed, prohibition area 1 setting step ① S140 is carried out.

Areas in which any additional pattern should not be generated are herein given as zp shown in FIG. 2(d). However, there is a case where apart from design, such a pattern is prepared by handiwork or where the result of the Boolean operation of patterns dp of design pattern data DP which is a design layer and patterns of another layer are applied. Data showing the area zp is designated as area data DP.

Through the sizing figure processing, the area zp shown in FIG. 2(d), is over-sized by a prescribed distance MJ and is subtracted from basic additional pattern area da so that additional pattern area data EA having an area corresponding to area ea of FIG. 2(d) is formed.

In FIG. 2(d), areas which are gained by over-sizing area zp are designated as areas zp1, and areas formed by adding areas zp and areas zp1 are designated as area xa with no additional patterns, wherein MJ is for example 2 μm, and pad patterns and others are given as patterns zp.

When any prohibition area 1 does not exist, additional pattern area data DA outputted from the basic additional pattern data generating step S120, is used newly as additional pattern data EA. It is then unnecessary to keep a distance from additional patterns wherein whether prohibition area 2, which is an area in which any additional pattern should not be generated, exists or not is decided (step 150). When prohibition area 2 exists, prohibition area 2 setting step ② S160 is carried out.

An area in which any additional pattern should not be generated is herein given as area ya shown in FIG. 2(e). However, there is a case where apart from design, such a pattern is prepared by handiwork or a case where the result of the Boolean operation of patterns dp of design pattern data DP which is the design layer and patterns of other layers are applied. Data showing the area ya is designated as area data YA. The area data YA showing area ya, which is prohibition area 2, is subtracted from the area pattern data EA, which is output from prohibition area 1 setting step S140, through the Boolean NOT so that additional pattern area data FA having new area fa is obtained. As arrangement pattern area ya which is prohibition area 2, circumferential region of design pattern data which has no connection with whether pattern density is high or low, and others is given.

In decision (S150) of whether prohibition area 2 exists or not, when prohibition area 2 does not exist, additional pattern area data EA is newly set as additional pattern area data FA. Then, in additional pattern data generating step S170, arrangement patterns in which basic additional pattern figures dt are disposed on the basis of rule are generated for the area corresponding to the design pattern data area (the whole area aa) so that additional pattern data DT is obtained.

Finally, in reverse additional pattern data generating step (S180), the additional patterns included in area fa of additional area pattern data FA are selected as additional pattern data FP (S190), wherein additional pattern data DT is subtracted from additional area pattern data FA, through the Boolean NOT so that reverse pattern data FP of final additional patterns is formed.

The second embodiment of a method for forming pattern data of the present invention is explained referring to FIGS. 3 and 4. In this embodiment, in order to explain it, similar to the first embodiment, pattern data DP having only patterns dp of FIG. 2(a) is also set as design data (FIG. 4(a)) and a case where additional pattern data corresponding to the pattern data is generated is explained.

In this embodiment, similar to the first embodiment, pattern data is applicable for a usual writing system wherein a positive resist is used and writing is made by applying an electron beam or a laser beam to parts having no pattern data. In order to explain it simply, pattern data DP having only patterns dp is set as design data (FIG. 4(a)), and generation of reverse main pattern data FP for generating patterns corresponding to this pattern data DP and patterns corresponding to patterns dp of design pattern data DP is explained.

First, in reverse main pattern generating step S210, reverse main pattern data for forming patterns corresponding to design patterns dp having no additional pattern is formed. Minimum interval MI between patterns dp and each additional pattern of additional pattern data DP is set to a given amount (for example $2\mu$). Patterns dp of the design pattern data DP are over-sized by distance MI through the sizing figure processing so that area data DP1 having area NA is formed (corresponding to FIG. 2(h)).

Through the Boolean NOT, patterns dp of the design pattern data DP are subtracted from area NA of the area data DP1 so that reverse main pattern data MP is obtained (FIG. 4(b)). In the manner similar to that of the first embodiment, basic additional pattern area data DA having basic additional pattern area da is formed (FIG. 4(c), S220).

Further, in a manner similar to that of the first embodiment and in additional pattern data generating step (S230), an arrangement pattern is generated in which basic additional pattern figures dt are disposed on the basis of rule and are generated for area aa corresponding to design pattern data area (FIG. 2(i)) so that additional pattern data DT is obtained (FIG. 4(d)). Further, in a manner similar to that of the first embodiment, in reverse additional pattern generating step (S240), additional patterns included in area da of basic additional pattern area data DA are selected as additional pattern data FP2 (FIG. 4(e)). Additional pattern data DT is subtracted from basic additional pattern area data DA so that additional pattern data FP2 is obtained.

On the other hand, in the manner of the first embodiment, a data showing area (FIG. 4(f)) formed by adding prohibition areas zp and areas zp1 is obtained as area data XA. Data showing area ya (referring to FIG. 4(g)), which is formed of prohibition areas 2, is obtained as as area data YA, referring to (FIG. 4(g)).

Then, through the Boolean OR, data showing areas xa, which are prohibition areas 1, namely area data XA and data showing area ya, which is prohibition area 2, namely area data YA are added in order to reverse additional pattern data FP2 so that reverse additional pattern data FP is formed. Even when processing is made in the manner of the second embodiment, the same reverse additional pattern data FP as in the first embodiment is obtained.

The third embodiment of a method for forming additional pattern data of the present invention is explained referring to FIGS. 5 and 6. The present embodiment further comprises a step of eliminating broken additional patterns included in reverse additional pattern data FP obtained in the methods of the first embodiment and the second embodiment.

Broken additional patterns are generated after figure operation. This is because area with no additional pattern, formed by over-sizing patterns of the design pattern data DP, or the above-mentioned prohibition areas 1 or 2, formed before over-sizing of the patterns of the design pattern data DP, are overlapped with additional patterns.

Only processing after reverse additional pattern data FP is explained herein. In such a manner as the first embodiment, final additional pattern generating pattern data FA having the final additional pattern generating area fa can be obtained (FIG. 6(a), S310)).

For additional pattern generating area data FA having additional pattern generating area fa, additional pattern generating area fa is subtracted from the whole area aa through the Boolean NOT processing so that reverse area data NP having reverse area np is formed. The reverse area np is then subtracted from the whole area aa and under-sized by β, for example, by 0.5 μm, through the sizing processing to form areas designated as snp, so that data NB of a boundary area with no additional pattern is formed (FIG. 6(b), S320).

If a set having overlapping portions in which boundary area nb having no additional pattern besides the whole additional pattern data DT is the set BS of additional patterns, additional patterns with broken portions being generated are included in set BS of additional patterns (FIG. 6(c)).

In step S330 of forming mask area in FIG. 5, an area is formed which includes the set BS of additional patterns including additional patterns with broken portions being generated. For data NB of the boundary area with no additional pattern and data DT of additional patterns being generated wholly, overlapped portions of the two are obtained to form data of patterns overlapping the boundary area designated as LP (FIG. 6(d)).

Data LP of patterns overlapping boundary areas is then over-sized by γ, through the sizing figure processing so that inclusion area data MAP which includes set BS of additional patterns with broken portions being generated is formed (FIG. 6(e)). Since the data LP of patterns overlapping boundary areas can form fine patterns, for example γ is the size of additional pattern. Then, for inclusion area data MAP and additional pattern area data FA, overlapped portions of the two are obtained through the figure Boolean AND processing so that mask area data KP is formed, which includes set BS of additional patterns with broken portions being generated (FIG. 6(f)). Finally, the mask area data KP is combined with reverse additional pattern data FP formed after the step S310 of generating data of reverse additional pattern data through the Boolean OR processing so that set BS of additional patterns with broken portions being generated within additional pattern area fa comes to have no existence and so reverse additional pattern data GP having broken portions is formed (FIG. 6(g), S340).

The fourth embodiment of a method for forming pattern data of the present invention is explained referring to FIGS. 7 and 8. In the present embodiment, a step of eliminating broken additional patterns being generated is added to the obtained reverse additional pattern data GP.

In case of pattern density of additional patterns being higher, when a means for eliminating broken patterns according to the above-mentioned third embodiment is applied, there is a possibility that when data LP of patterns overlapping boundary area is over sized by γ, over-sized patterns will interfere with additional patterns with no broken portion.

Namely, since the pattern density is high, patterns of inclusion area data MP.come to have portions overlapped by original additional patterns with no broken portion. Therefore, adding of patterns of data MP of inclusion area to reverse additional patterns FP will result in new broken additional patterns.

FIG. 8(a) shows additional patterns FA with no boundary area, each pattern dt of data DT for generated additional patterns and a set BS of additional patterns having partially overlapped portions by additional pattern area NB with no boundary.

FIG. 8(b) shows the overlapping portions data LP1 of data DT of generating additional pattern over boundary area NB with no additional pattern.

FIG. 8(c) shows inclusion area data MAP formed by over-sizing overlapping pattern data LP1 by γ.

Each pattern of inclusion area data MAP1 of FIG. 8(c) has portions overlapping adjacent additional patterns originally having no broken portion, wherein the set of portions overlapping adjacent patterns originally having no broken portion is designated as NS.

Accordingly, as in the third embodiment, mask area data KP is formed and the mask area data KP is added to the additional area pattern data FA so the set NS of additional pattern becomes a set of additional patterns including broken additional patterns. The present embodiment provides a means for addressing such a problem. As in the manner of the third embodiment, the boundary area with no additional patterns is represented as NB.

In a step of generating patterns with no additional pattern, partial additional pattern area data DTi ($1 \leq i \leq n$) is generated with lower pattern density in such a manner that additional patterns are disposed every other or in every third place, wherein steps of generating a pattern with no additional pattern are carried out repeatedly until broken portions are eliminated. The sum total of partial additional pattern data DTi ($1 \leq i \leq n$) becomes data DT for the whole additional pattern data. The number of steps n of partial additional patterns for lowering pattern density is set.

Since n is decremented while steps of generating patterns with no additional pattern are repeatedly carried out, subscripted processing with n is carried out.

In the step n of generating stepwise patterns (S430), partial additional patterns data DTn is generated for the whole area aa with lower pattern density in such a manner that additional patterns are disposed in every other or in every third place.

A step of generating reverse additional patterns data corresponding to the above-mentioned description (S440), a step of forming mask area (S450) and a step of eliminating broken additional patterns (S460) are carried out for partial additional pattern data DTn.

The above-mentioned steps correspond to steps S310 to S340 of a flow of process of eliminating broken additional patterns shown in FIG. 5, except for step S410 of forming boundary area data.

After step n of eliminating broken portions (S460) has been finished, n is decremented for partial additional pattern data DTn. When n comes to 0, the step of eliminating broken patterns is finished. If n is not 0, step n (S430) of stepwise generating additional patterns to step n (S460) of eliminating broken patterns are carried out repeatedly until n comes to 0, so that the final reverse additional patterns are obtained.

One embodiment of a method for writing of the present invention is explained simply. The present embodiment is a method for writing a photomask by means of an electron beam lithographer and a method for writing a photomask with additional patterns which make uniform pattern density of photomask used in the process of producing of LSI, in order to make the surface of the wafer uniform in the process of producing of LSI.

A substrate having a positive resist applied on an exposed face (face applied by electron beam) thereof is used as a photomask substrate for producing a photomask. This embodiment is a method of writing wherein reverse main pattern data MP and reverse additional pattern data FP formed by a method for forming pattern data of the first embodiment are used. This embodiment is explained hereafter.

First, using reverse main pattern data MP shown in FIG. 2(b), a first writing is carried out for writing on an area on the photomask substrate corresponding to the data area of the reverse main pattern data MP. After the first writing, the area on the photomask substrate corresponding to the area mp and the outer portion of area NA out of the whole area (corresponding to area aa) are left unexposed. Then, using reverse additional pattern data FP shown in FIG. 2(g), a second writing is carried out for writing on areas of the photomask substrate corresponding to data area. After the second writing, white areas of the photomask substrate shown in FIG. 2(f) are left unexposed.

By carrying out the first writing and the second writing, an area on the photomask corresponding to pattern data DP of FIG. 2(a) is left unexposed. Thereafter, by developing the photomask substrate, resist portions corresponding to patterns dp shown in FIG. 2(a) and additional patterns can be left on the photomask substrate. In such a way, the first writing and the second writing are carried out separately and overwriting is made so that desired patterns with additional patterns can be formed. Of course, the order of writing of the first writing and the second writing can be altered.

The present invention can provide a method for writing applicable for a usual system of writing wherein in a method for writing a phototnask with additional patterns, in which the photomask is provided with additional patterns which make uniform the pattern density of the photomask, positive resist is used and writing is made by applying an electron beam or a laser beam to portions with no pattern data. Further, the present invention can provide a method for forming pattern data wherein the method is also applicable for processing layers, such as poly-silicon and others, and it does not take a great deal of time to form the pattern data.

What is claimed is:

1. A method for forming pattern data in a method of processing data for forming writing data for a photomask with additional patterns for making uniform pattern density of the photomask, in designing layout of electronic circuit or in forming the production of the photomask, when a minimum interval (MI) between each figure data (dp) of design pattern data (DP) which has been designed without consideration to additional pattern and each figure (dt) of data (DT) for additional patterns to be formed in a data is set so as to avoid the interference of each figure (dp) of the design pattern data (DP) with each figure (dt) of data (DT) for additional patterns to be formed, the method for forming pattern data comprises:

(a) a step of generating reverse main pattern data (MP) wherein sizing figure processing is taken to the design pattern data (DP) so that pattern data (DP1) having an area (NA) with no additional pattern is formed by over-sizing each figure (dp) of pattern data (DP) by the minimum interval (MI), and the Boolean NOT is taken to the design pattern data (DP) and the pattern data (DP1) so as to subtract each figure (dp) of the design pattern data (DP) from the area (NA) with no additional pattern so that the reverse main pattern data (MP) having a reverse figure (mp) is formed;

(b) a step of generating basic additional pattern area data (DA) wherein the Boolean NOT is taken to a whole area data (AA) showing a whole area (aa) of design pattern data area and the pattern data (DP1) so as to subtract the area (NA) of no additional pattern from the whole area (aa) so that the basic additional pattern area data (DA) forming a basic additional pattern area (da) is generated;

(c) a step of generating additional pattern area data wherein an area of forbidden additional pattern is determined, and the area of forbidden additional pattern is subtracted from the basic additional pattern area (DA) so that additional pattern area data (FA) with additional pattern area (fa) is formed;

(d) a step of forming the data (DT) for original additional patterns, wherein the data (DT) for additional patterns is generated in which the figure (dt) of data for additional patterns is placed regularly in the whole area corresponding to the design pattern data area; and (e) a step of generating reverse additional pattern data wherein the Boolean NOT is taken to the additional pattern area data (FA) and the data (DT) for additional patterns so as to subtract each figure of data (DT) for additional patterns from the additional pattern area (fa) so that reverse additional pattern data (FP) is formed.

2. A method for forming pattern data as claimed in claim 1, wherein the area of forbidden additional pattern is determined according to the relation between photomasks for exposing for forming processing layers being adjacent to each other in the process of forming a wafer, namely by the relation of positions between design data of respective layers which are data for the respective photomasks for exposing, that the area of forbidden additional pattern includes a first area of forbidden additional pattern which should keep a space (MJ) from additional patterns to be formed and a second area of forbidden additional pattern which is not required to keep a space from additional patterns to be formed, wherein the first area of forbidden additional pattern is an area (xa) having no additional patterns which is obtained by over-sizing an area (zp) of area pattern data newly prepared as another area data, pattern data of other layers, and pattern data obtained from the result of Boolean operation of two or more patterns data selected from among area of the above-mentioned pattern data newly prepared as another area data, pattern data of other layers, or design pattern data (DP) separated by the space (MJ), through sizing figure processing and the second area of forbidden additional pattern is an area (ya) having no additional pattern which is area pattern data newly prepared as another area data, or pattern data of another layer, or area having no additional pattern obtained from the result of Boolean operation of two or more pattern data selected from among area of the above-mentioned pattern data newly prepared as another area data, pattern data of other layers, or design pattern data (DP).

3. A method for forming pattern data as claimed in claim 1, wherein the method for forming pattern data further comprises:
(f) a step of forming a boundary area (nb) wherein after the step of forming reverse additional pattern data, an area (np) having no additional pattern is formed by subtracting an additional pattern area (fa) from the whole area (aa), through the Boolean NOT, an area (snp) is formed by under-sizing the area (np) having no additional pattern by β through sizing figure processing, and the boundary area (nb) having no additional patterns is formed by subtracting the areas (snp) formed by under-sizing from the area (np) having no additional pattern, through the Boolean NOT;
(g) a step of forming a mask area data wherein when additional patterns of data (DT) for additional patterns which overlap the area (nb) of boundary area having no additional pattern is a set (BS) of additional patterns, additional pattern data (LP) which overlaps over the boundary area (nb) having no additional pattern is formed through the Boolean AND, inclusion area data (MAP) having an inclusion area in which the set (BS) of additional patterns is included is formed by over-sizing respective patterns of additional pattern data (LP) by γ, and mask area data (KP) having a mask area which is Boolean AND of the inclusion pattern data (MAP) and the boundary data (FA) having no additional pattern is formed; and
(h) a step of generating a second reverse additional pattern data wherein the mask area data (KP) is added to the reverse additional pattern (FP) through the Boolean OR so as to eliminate deficient additional patterns in the reverse additional patterns (FP) so that a second additional pattern data (GP) is formed.

4. A method for forming pattern data as claimed in claim 3, wherein after the step of forming data for additional patterns which generates data (DT) for additional patterns, because of high pattern density of the data (DT) for additional patterns, mask area of the mask area data (KP) interferes with a set (NS) of additional patterns which is in close vicinity of the set (BS) of additional patterns, in order to avoid breaking additional patterns of the set (NS) of additional patterns in the step of generating for forming the second reverse additional pattern data (GP), n pieces of partial pattern data (DTi) having low pattern density in such a manner that the sum total of respective additional pattern data (DTi) ($1 \leq i \leq n$) forms additional pattern data, and so that the method for forming pattern data further comprises:
(i) a step of forming a mask area data wherein mask data (KPi) having a mask area including a partial additional pattern deficient is formed from the overlapping of additional boundary pattern (NB) having no additional pattern and partial pattern data (DTi), through the sizing figure processing; and
(j) a step of generating reverse additional patterns wherein respective mask area data (KPi($1 \leq i \leq n$)) are added to the reverse additional pattern data so that respective additional pattern data (GPi($1 \leq i \leq n$)) having no deficient pattern is obtained.

5. A method for forming pattern data as claimed in claim 1, wherein steps after the step of forming additional patterns or the whole steps are carried out by photomask writing data.

6. A method for forming pattern data in a method of processing data for forming writing data for a photomask with additional patterns for making uniform pattern density of the photomask, in designing layout of electronic circuit or in forming the production data of the photomask, when a minimum interval (MI) between each figure (dp) of design pattern data (DP) which has been designed without consideration to additional patterns and each figure (dt) of data (DT) for additional pattern data to be formed in a data area is set so as to avoid interference of each pattern data (DP1) of the design pattern data (DP) with each figure (dt) of data (DT) for additional figures (dp) to be formed, the method for forming pattern data comprises:
(a) a step of generating reverse main pattern data (MP) wherein sizing figure processing is taken to the design pattern data (DP) so that pattern data (DP1) having an area (NA) with no additional pattern is formed by over-sizing figures (dp) by the minimum (MI), and the Boolean NOT is taken to the design pattern data (DP) and the pattern data (DP1) so as to subtract each pattern data (DP1) of the design pattern data (DP) from an area (NA) with no additional pattern so that reverse main pattern data (MP) having reverse patterns (mp) is formed;
(b) a step of generating basic additional pattern data (DA) wherein the Boolean NOT is taken to a whole area (aa) of design pattern data area and the pattern data (DP1) so as to subtract the area (NA) of no additional pattern from the whole area (aa) so that a basic additional pattern data (DA) forming a basic additional pattern area (da) is generated;
(c) a step of generating data for additional patterns wherein data (DT) for additional patterns is generated in which the figures (dt) forming the basis of the additional patterns are regularly arranged for the whole area corresponding to the design pattern data area;
(d) a step of generating basic reverse additional pattern data (FP2) wherein the Boolean NOT is taken to the basic additional pattern data (DA) and the data (DT) for additional patterns so as to subtract the data (DT) for additional patterns from the basic additional pattern area (da) so that reverse additional pattern data (FP2) is formed; and (e) a step of generating reverse additional pattern data wherein an area of forbidden additional pattern is determined and reverse additional pattern data (FP) is formed, by adding the area of forbidden additional patterns to the reverse additional pattern data (FP2), through the Boolean OR.

7. A method for writing a photomask with additional patterns in a method for writing a photomask with additional patterns for making uniform pattern density of the photomask used in the production of LSI in order to make a surface of each process layer of a wafer flat in the production of LSI, reverse main pattern data (MP), reverse additional pattern data (FP) of the second reverse additional main data (GP) or reverse additional pattern data (GPi($1 \leq i \leq n$)) in a method for forming additional pattern data as claimed in claims 1 to 4 are used directly as photomask writing data or fractured to photomask writing data, respectively, and writings by the respective writing data are made separately so that writings are made on positive resist applied on a substrate for photomask with superimposing the writing data.

8. A method for writing a photomask with additional patterns as claimed in claim 7, wherein writings are made by means of an electron beam photomask writer or a laser beam photomask writer.

9. A method for forming pattern data as claimed in claim 6, wherein the area of forbidden additional pattern is determined according to the relation between photomasks for exposing for forming processing layers being adjacent to each other in the process of forming a wafer, namely by the relation of positions between design data of respective layers which are data for the respective photomasks for exposing, that the area of forbidden additional pattern includes a first area of forbidden additional pattern which should keep a space (MJ) from additional patterns to be formed and a second area of forbidden additional pattern which is not required to keep a space from additional patterns to be formed, wherein the first area of forbidden additional pattern is an area (xa) having no additional patterns which is obtained by over-sizing an area (zp) of area pattern data newly prepared as another area data, pattern data of other layers, and pattern data obtained from the result of Boolean operation of two or more patterns data selected from among area of the above-mentioned pattern data newly prepared as another area data, pattern data of other layers, or design pattern data (DP) separated by the space (MJ), through sizing figure processing and the second area of forbidden additional pattern is an area (ya) having no additional pattern which is area pattern data newly prepared as another area data, or pattern data of another layer, or area having no additional pattern obtained from the result of Boolean operation of two or more pattern data selected from among area of the above-mentioned pattern data newly prepared as another area data, pattern data of other layers, or design pattern data (DP).

10. A method for forming pattern data as claimed in claim 6, wherein the method for forming pattern data further comprises:

(f) a step of forming a boundary area (nb) wherein after the step of forming reverse additional pattern data, an area (np) having no additional pattern is formed by subtracting an additional pattern area (fa) from the whole area (aa), through the Boolean NOT, an area (snp) is formed by under-sizing the area (np) having no additional pattern by β through sizing figure processing, and the boundary area (nb) having no additional patterns is formed by subtracting the areas (snp) formed by under-sizing from the area (np) having no additional pattern, through the Boolean NOT;

(g) a step of forming a mask area data wherein when additional patterns of data (DT) for additional patterns which overlap the area (nb) of boundary area having no additional pattern is a set (BS) of additional patterns, additional pattern data (LP which overlaps over the boundary area (nb) having no additional pattern is formed through the Boolean AND, inclusion area data (MAP) having an inclusion area in which the set (BS) of additional patterns is included is formed by over-sizing respective patterns of additional pattern data (LP) by γ, and mask area data (KP) having a mask area which is Boolean AND of the inclusion pattern data (MAP) and the boundary data (FA) having no additional pattern is formed; and (h) a step of generating a second reverse additional pattern data wherein the mask area data (KP) is added to the reverse additional pattern (FP) through the Boolean OR so as to eliminate deficient additional patterns in the reverse additional patterns (FP) so that a second additional pattern data (GP) is formed.

11. A method for forming pattern data as claimed in claim 10, wherein after the step of forming data for additional patterns which generates data (DT) for additional patterns, because of high pattern density of the data (DT) for additional patterns, mask area of the mask area data (KP) interferes with a set (NS) of additional patterns which is in close vicinity of the set (BS) of additional patterns, in order to avoid breaking additional patterns of the set (NS) of additional patterns in the step of generating for forming the second reverse additional pattern data (GP), n pieces of partial pattern data (DTi) having low pattern density in such a manner that the sum total of respective additional pattern data (DTi($1 \leq i \leq n$)) forms additional pattern data, and so that the method for forming pattern data further comprises:

(i) a step of forming a mask area data wherein mask data (KPi) having a mask area including a partial additional pattern deficient is formed from the overlapping of additional boundary pattern (NB) having no additional pattern and partial pattern data (DTi), through sizing figure processing, and (j) a step of generating reverse additional patterns wherein respective mask area data (KPi($1 \leq i \leq n$)) are added to the reverse additional pattern data so that respective additional pattern data (GPi($1 \leq i \leq n$)) having no deficient pattern is obtained.

* * * * *